(12) United States Patent
Zhou et al.

(10) Patent No.: US 8,847,594 B2
(45) Date of Patent: Sep. 30, 2014

(54) METHOD FOR REDUCING ARTIFACTS IN MAGNETIC RESONANCE IMAGING

(75) Inventors: Xiaohong Joe Zhou, Naperville, IL (US); Novena A. Rangwala, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 553 days.

(21) Appl. No.: 13/263,608

(22) PCT Filed: Apr. 13, 2010

(86) PCT No.: PCT/US2010/030951
§ 371 (c)(1),
(2), (4) Date: Oct. 7, 2011

(87) PCT Pub. No.: WO2010/120829
PCT Pub. Date: Oct. 21, 2010

(65) Prior Publication Data
US 2012/0025826 A1 Feb. 2, 2012

Related U.S. Application Data

(60) Provisional application No. 61/169,232, filed on Apr. 14, 2009.

(51) Int. Cl.
*G01R 33/48* (2006.01)
*G01R 33/565* (2006.01)
*G01R 33/483* (2006.01)
*G01R 33/561* (2006.01)

(52) U.S. Cl.
CPC ...... *G01R 33/56518* (2013.01); *G01R 33/4833* (2013.01); *G01R 33/56572* (2013.01); *G01R 33/5617* (2013.01); *G01R 33/56563* (2013.01)
USPC .......................................... 324/309; 324/307

(58) Field of Classification Search
CPC ........... G01R 33/4833; G01R 33/5617; G01R 33/56518; G01R 33/56572
USPC .................................................. 324/307, 309
See application file for complete search history.

(56) References Cited

U.S. PATENT DOCUMENTS 5,184,075 A 2/1993 Nishimura
6,134,465 A 10/2000 Frederick et al.
(Continued)

FOREIGN PATENT DOCUMENTS

EP 1 079 238 2/2001
JP 05 300895 11/1993

OTHER PUBLICATIONS

Steckner, et al., "The FSE "cusp" artifact: interactions between rf rolloff, gradient rollover, and B0 homogeneity", Proceedings of The International Society for magnetic Resonance in Medicine, 1995, p. 756, XP002592727, Nice, France.

(Continued)

*Primary Examiner* — Melissa Koval
*Assistant Examiner* — Rishi Patel
(74) *Attorney, Agent, or Firm* — McDonnell Boehnen Hulbert & Berghoff LLP

(57) ABSTRACT

Disclosed are methods for magnetic resonance imaging (MRI) that reduce the appearance of artifacts in a final image. Also provided are a computer readable medium comprising instructions that when executed by a CPU results in the reduction of artifacts in a magnetic resonance image, and an MRI apparatus comprising the computer readable medium. Also disclosed is a data processing method that provides further reduction of residual artifacts in a magnetic resonance image. The disclosed methods provide a simple and effective approach to ameliorate various artifacts in virtually any type of MRI scanners.

15 Claims, 10 Drawing Sheets

(56) References Cited

U.S. PATENT DOCUMENTS 6,323,646 B1 11/2001 Zhou et al.
7,250,762 B2 7/2007 King et al.

OTHER PUBLICATIONS

Rangwala, et al., "Reduction of fast spin echo cusp artifact using a slice-tilting gradient," Magnetic Resonance in Medicine: Official Journal of The Society of Magnetic Resonance in Medicine/Society of Magnetic Resonance in Medicine, Jul. 2010, vol. 64, No. 1, pp. 220-228.
Kim, et al., 1999, ISMRM Abstracts, p. 1033, Philadelphia, PA.
Larkman, et al 2000, J Magn Reson Imaging 12:795:797.
Pruessmann, et al, 1999, Magn Reson Med, 42:952:962.
Schaefer, 1998, Magn Reson Imaging Clin N Amer, 6:775:789.
International Search Report for International Application No. PCT/US2010/030951 filed Apr. 13, 2010.

METHOD FOR REDUCING ARTIFACTS IN MAGNETIC RESONANCE IMAGING

BACKGROUND

Magnetic resonance imaging (MRI) is commonly used to image the internal tissues of a subject. MRI is typically performed by placing the subject or object to be imaged at or near the isocenter of a strong, uniform magnetic field known as the main magnetic field. The main magnetic field causes the atomic nuclei that possess a magnetic moment in the matter comprising the subject or object to become aligned in the magnetic field. The nuclei (spins) begin a precession around the magnetic field direction at a rate which is proportional to the magnetic field strength. For hydrogen nuclei (which are the common nuclei employed in MRI), the precession frequency is approximately 64 MHz in a magnetic field of 1.5 Tesla.

In addition to the main magnetic field, a magnetic field gradient is also applied to form a magnetic resonance image. The magnetic field gradient in an MRI scanner is linear only within a limited region near the magnet isocenter. Outside of this region, virtually all gradient systems display nonlinear spatial characteristics, particularly at or near the edge of the magnet. This non-ideal condition is exacerbated by a rapid change of the main magnetic field (denoted as $B_0$-field) toward the end of the magnet bore. As a result, the overall magnetic field produced by the combination of the gradient field and the $B_0$-field has a complicated spatial dependence. In regions away from the isocenter, the overall magnetic field experienced by spins can be equal to the net magnetic field at or near the magnet isocenter. (Steckner et al., 1995, ISMRM Abstracts, pg. 756, Nice, France). These regions, sometimes referred to as the "gradient null", are typically outside the imaging volume of interest. (King et al., U.S. Pat. No. 7,250,762). When a radiofrequency (RF) coil (or a coil element in a phased array) receives signals from that region, the signal will carry the same or similar frequency as the signal near the isocenter, leading to an aliasing artifact in the image. In a fast spin echo (FSE) pulse sequence, the aliasing artifact manifests itself as a series of spots, a band, or a "featherlike" artifact at or near the center of the field of view (FOV) along the phase-encoding direction. The artifact is often observed on sagittal or coronal planes in spine and knee scans, and can interfere with image interpretation. (Kim et al., 1999, ISMRM Abstracts pg. 1033, Philadelphia, Pa.). Various terms have been used to identify this artifact including, for example, cusp artifact, annefact, fold-over artifact, feather artifact, and peripheral signal artifact, along with other names. See, the Steckner, King, and Kim references, ibid. Although this artifact does not appear in exactly the same form (i.e., it is sometimes "C"-shaped), the mechanism of the artifact formation remains substantially the same.

One technique designed to reduce this artifact relies on adaptive phased-array coils (Frederick and Johnson, U.S. Pat. No. 6,134,465). Individual elements of a phased-array coil can be chosen automatically by an algorithm that determines the proper coil elements based on user-specified FOV, while also rejecting the signals from coil elements at or near the artifact-prone regions. However, this approach has been shown to be effective only under specific conditions (e.g., imaging with limited FOV). Further, in order to implement adaptive phased array, substantial modifications to the RF receiving electronics are required in addition to a signal selection algorithm.

To avoid excessive costs associated with hardware modifications, signal-processing techniques based on parallel imaging (e.g., sensitivity encoding) have been used to reduce the FSE cusp artifact. See, U.S. Pat. No. 7,250,762; Larkman et al., 2000, *J Magn Reson Imaging* 12:795-797; Pruesssmann et al., 1999, *Magn Reson Med*, 42:952-962. These signal-processing techniques are based on estimating an amplitude of the RF field sensitivity matrix by utilizing two separate coils, one placed at the magnet isocenter and the other (typically smaller in size) at or near the artifact-producing region. The non-aliased signal within the FOV can be recovered using a parallel-imaging reconstruction algorithm (Pruessmann, Id.). However, this approach requires knowledge of the approximate location of the artifact-producing region and also requires a calibration procedure to estimate the sensitivity matrix for each RF coil. These limitations can impose problems in practical implementation of the method.

Another approach to reducing such an artifact utilizes a metal foil (also known as "metal skirt" or "RF blanket") over the artifact-producing region in order to dephase the magnetization leading to the artifacts. To be effective, this technique needs the RF blanket to be positioned exactly at the location of the artifact source (i.e., the precise location of the artifact source must be known). This method also raises safety concerns due to the possibility of increased local heating. (Schaefer, 1998, *Magn Reson Imaging Clin N Amer.* 6:775-789). These safety concerns can become prohibitive in a SAR-intensive sequence, such as FSE, particularly at high magnetic fields (e.g., 3.0 T).

Accordingly, there is a need in the field of MRI for straightforward, cost effective, and safe techniques for reducing the cusp artifact.

SUMMARY

Aspects of this disclosure relate to a method for reducing the appearance of an artifact in a magnetic resonance image of an object comprising: applying an excitation radiofrequency (RF) pulse simultaneously with a magnetic field gradient ($G_{yt}$) along a non-slice-selection direction (e.g., the phase-encoding direction) and a nominal slice selection gradient ($G_z$), and subsequently applying a slice-selective refocusing radiofrequency (RF) pulse; wherein $G_{yt}$ tilts the slice selected by the excitation RF pulse by an angle $\Theta_y$ relative to the nominal slice selected by the refocusing RF pulse.

Aspects of this disclosure also relate to a method for reducing the appearance of an artifact in a magnetic resonance image of an object comprising:
  (a) applying to the object an excitation radiofrequency (RF) pulse simultaneously with a first gradient ($G_{yt}$) and a second gradient ($G_z$); and
  (b) subsequently applying to the object a third gradient ($G_{ytr}$) and a fourth gradient ($G_{zr}$) and then applying a slice-selective refocusing RF pulse; and
  (c) acquiring magnetic resonance data from the object;
wherein $G_{yt}$ comprises a gradient applied along a non-slice-selection axis (e.g., the phase-encoding axis) and $G_z$ comprises a slice selection gradient applied along the z-axis such that the slice selected by the excitation RF pulse is tilted by an angle $\Theta_y$ relative to the slice selected by the refocusing RF pulse; and
wherein $G_{ytr}$ comprises a third gradient applied along a non-slice-selection axis (e.g., the phase-encoding axis) and $G_{zr}$ comprises a slice refocusing gradient or a combination of a slice refocusing gradient and a slice-selection crusher gradient.

Aspects of this disclosure further relate to a computer readable medium having stored thereon a set of instructions executable by a computing device to control a magnetic resonance imaging (MRI) apparatus, to cause the MRI apparatus to perform the functions of:

(a) applying to an object in the MRI apparatus an excitation radiofrequency (RF) pulse simultaneously with a first gradient ($G_{yt}$) and a second gradient ($G_z$);

(b) subsequently applying to the object a third gradient ($G_{ytr}$) and a fourth gradient ($G_{zr}$) and then applying a slice-selective refocusing RF pulse; and (c) acquiring magnetic resonance data from the object;

wherein $G_{yt}$ comprises a gradient applied along a non-slice-selection axis (e.g., the phase-encoding axis) and $G_z$ comprises a slice selection gradient applied along the z-axis such that the slice selected by the excitation RF pulse is tilted by an angle $\Theta_y$ relative to the slice selected by the refocusing RF pulse; and wherein $G_{ytr}$ comprises a third gradient applied along a non-slice-selection axis (e.g., the phase-encoding axis) and $G_{zr}$ comprises a slice refocusing gradient or a combination of a slice refocusing gradient and a slice-selection crusher gradient.

Aspects of this disclosure still further relate to a magnetic resonance imaging (MRI) apparatus comprising:

(a) an MRI system having a plurality of gradient coils positioned about the bore of a magnet to impress a polarizing magnetic field and an radio frequency (RF) transceiver system and an RF switch controlled by a pulse module to transmit RF signals to an RF coil assembly to acquire MR images; and (b) a computer programmed to:

(i) apply to an object in the MRI apparatus an excitation radiofrequency (RF) pulse simultaneously with a first gradient ($G_{yt}$) and a second gradient ($G_z$);

(ii) subsequently apply to the object a third gradient ($G_{ytr}$) and a fourth gradient ($G_{zr}$) and then apply a slice-selective refocusing RF pulse; and (iii) acquire magnetic resonance data from the object;

wherein $G_{yt}$ comprises a gradient applied along a non-slice-selection axis (e.g., the phase-encoding axis) and $G_z$ comprises a slice selection gradient applied along the z-axis such that the slice selected by the excitation RF pulse is tilted by an angle $\Theta_y$ relative to the slice selected by the refocusing RF pulse; and wherein $G_{ytr}$ comprises a third gradient applied along a non-slice-selection axis (e.g., the phase-encoding axis) and $G_{zr}$ comprises a slice refocusing gradient or a combination of a slice refocusing gradient and a slice-selection crusher gradient.

Further aspects of this disclosure relate to a method for processing data in a magnetic resonance image (MRI) comprising:

(a) identifying a residual artifact in a magnetic resonance image;

(b) fitting the artifact in the shape of a line;

(c) executing an operation that zeroes out signal intensities within the line of (b) in the phase-encoding direction of the magnetic resonance image; and (d) executing an operation that interpolates the zeroed signal intensities from data represented as pixels immediately adjacent to the line of (b).

Additional aspects of this disclosure and various embodiments of these aspects will be apparent to one of skill in the art in light of the following detailed description. The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
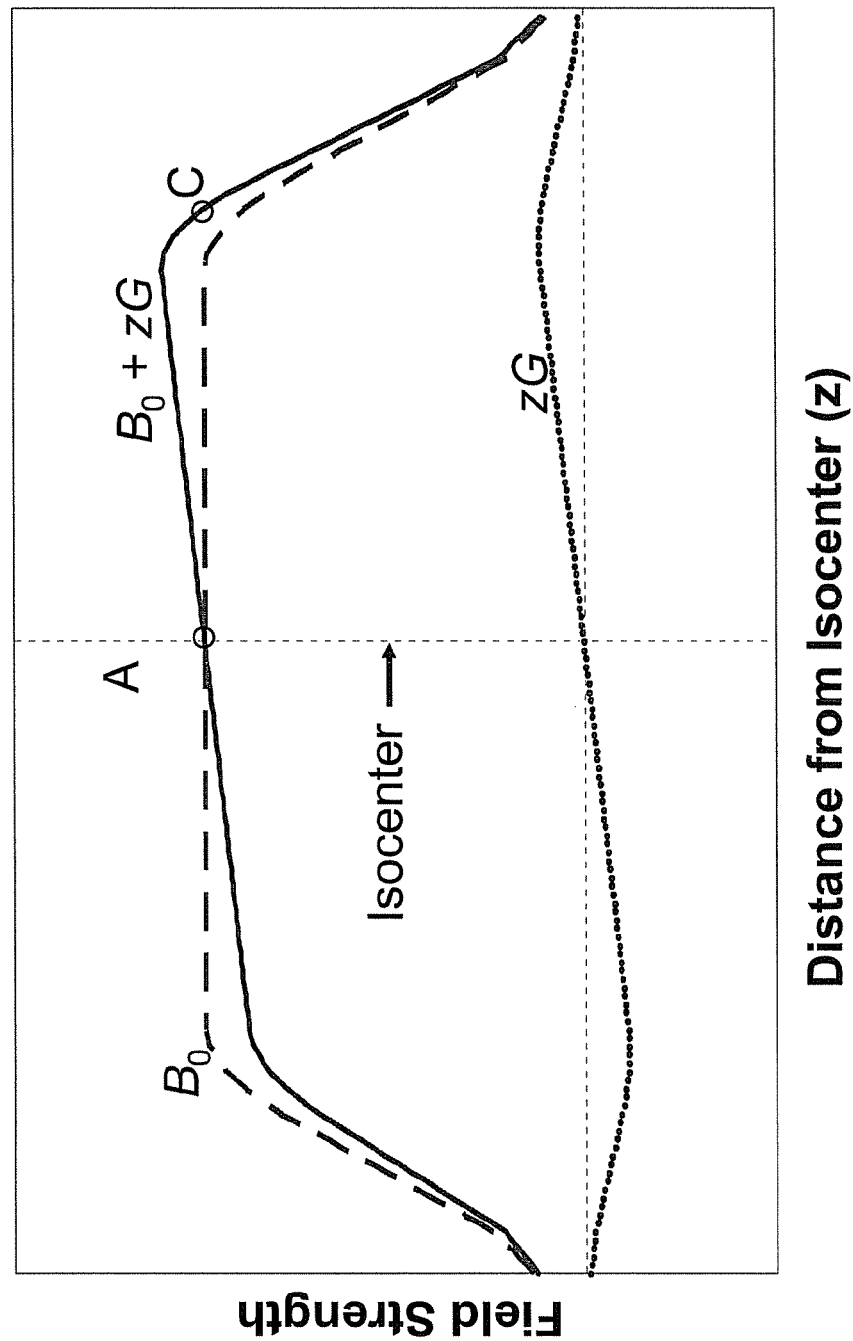
FIG. 1 depicts the profile of $B_{tot}=B_0+z \times G$ through the bore of the scanner. Due to the nonlinearity of G and rapid change of amplitude of $B_0$-field at or near the edge of the magnet, position C experiences the same net magnetic field as position A at the isocenter, leading to cusp artifacts.

shows the normalized profiles of signal intensity in the phase-encoding direction as a function of slice thickness ($\Theta_y=2°$, single-slice acquisition), TR/TE=2000/10 ms and FOV=24 cm.

DETAILED DESCRIPTION

The disclosure provides methods for reducing magnetic resonance imaging (MRI) artifacts, particularly FSE cusp artifacts, through pulse sequence modification. The methods do not necessitate or involve any hardware change or coil sensitivity calibration of an MRI apparatus, and raise no potential safety concerns related to SAR or RF-induced local heating. The methods, computer readable media, and systems described herein reduce the FSE cusp artifact in a cost-effective and safe manner.

When compared to existing methods for FSE cusp artifact reduction, the slice-tilting technique disclosed herein offers a number of advantages. First, unlike adaptive phased array methods, the slice-tilting technique requires no change in the system hardware. As such, it is simpler to implement and applicable to virtually all scanners where the FSE cusp artifact is problematic. Second, the slice-tilting technique imposes no changes in image reconstruction algorithms. This is in sharp contrast to known parallel imaging approaches in which the coil sensitivity profiles must be incorporated into image reconstruction. Third, the calibration procedure in the slice-tilting technique (as described in Example 1 and FIG. 5) is simple and straightforward. It does not require an additional RF coil to acquire signals from the artifact-prone region, and one calibration can be used for a number of clinical protocols. Since the optimal tilt angle spans a very small range under most circumstances (e.g., see FIG. 5), the calibration procedure may even be eliminated by using a generic tilt angle in the range of 1-3°, as discussed herein. Fourth, compared with methods such as the application of an RF blanket, the slice-tilting technique imposes neither additional safety concerns nor changes in patient handling. Last, the slice-tilting technique exhibits better performance in FSE cusp artifact reduction when compared with two other available techniques in which the slice selection gradient polarity or the amplitude is manipulated in pulse sequence design. In addition, the slice-tilting technique can also avoid problems with chemical shift and other off-resonance effects encountered using other methods relying on changes in either gradient polarity or amplitude.

The terms "cusp artifact," "annefact," "foldover artifact," "feather artifact," "featherlike artifact," and "peripheral signal artifact" are used interchangeably herein, and refer to an aliasing artifact that arises from the signals of spins in regions outside of the imaging volume of interest. Although the cusp artifact is most frequently seen in FSE images as a series of spots, a band, or a feather, the term "cusp artifact" is defined more broadly herein, covering artifacts with the same or similar origin in images obtained using pulse sequences other than FSE.

As used herein the term "magnetic resonance imaging (MRI) apparatus" relates to hardware, software, and data storage media used to acquire and analyze magnetic resonance data, particularly imaging data. Typically the apparatus comprises a computer-based system that comprises minimum computer hardware including one or more of, but not limited to, a central processing unit (CPU), input means, output means and data storage means.

As used herein, the term "excitation radiofrequency (RF) pulse" means a pulsed RF magnetic field that nutates the magnetization from the longitudinal axis to the transverse plane.

As used herein, the term "phase-encoding gradient" means a gradient that encodes spatial information by means of manipulation of the phase of an MRI signal.

As used herein, the term "readout gradient" means a gradient that encodes spatial information by means of altering the frequency of an MRI signal.

As used herein, the term "slice selection gradient" means a gradient that is applied simultaneously with a radiofrequency pulse to select a slice from the imaged subject in MRI.

As used herein, the term "refocusing radiofrequency (RF) pulse" means a pulsed magnetic field, operating in the radiofrequency range, that refocuses the magnetization from an imaged object to form a spin echo.

As used herein, the term "spin echo" means an MRI signal that is produced by a combination of an excitation RF pulse and a refocusing RF pulse.

As used herein, the term "slice refocusing gradient" means a magnetic field gradient that removes the signal phase incoherence introduced by the slice selection gradient during the slice-selection process.

As used herein, the term "slice-selection crusher gradient" means a magnetic field gradient that is placed on either side of a refocusing RF pulse to destroy or dephase unwanted signals in MRI.

As used herein, the term "readout pre-phasing gradient" means a magnetic field gradient that is applied along the readout direction prior to the readout gradient in order to produce a coherent signal.

As used herein, the term "non-slice-selection axis" means any axis orthogonal to the axis along which a slice is selected.

As used herein, the term "z-axis" means the axis along which a slice is selected in MRI.

By "computer readable medium" is meant any non-transitory media which can be read and accessed directly by a computer and that can contain or store a computer program for use by, or in connection with, a computer related system or method e.g. so that the medium is suitable for use in the above-mentioned computer system. Such media may include, but are not limited to: magnetic storage media such as floppy discs, hard disc storage medium and magnetic tape; optical storage media such as optical discs or CD-ROM; electrical storage media such as RAM and ROM; and hybrids of these categories such as magnetic/optical storage media. Other possibilities exist as well.

In certain aspects, the disclosure provides methods for reducing artifacts in a magnetic resonance image, particularly FSE cusp artifacts in such magnetic resonance image, comprising application of a modified fast spin echo pulse sequence that tilts the slice selected by the radiofrequency (RF) excitation pulse away from the slice selected by the RF refocusing pulses.

In certain embodiments, the method comprises RF excitation and refocusing pulses that select image slices having an incomplete overlap at the artifact-producing region(s) but overlapping substantially within the field of view (FOV) so that the desired signals are largely retained and signals from the artifact-prone region are effectively reduced. In particular embodiments the methods provided herein decrease the strength of the cusp artifact by at least about 50% or more (e.g., about 55%, 60%, 65%, 70%, 75%, 80%, 85%, 90%, 95%, or 100%). In embodiments, the method further limits the spatial extent of the artifact.

In certain embodiments, the methods provided herein comprise applying to an object a first gradient ($G_{yt}$) and a second gradient ($G_z$) simultaneously with an excitation radiofrequency (RF) pulse; subsequently applying to the object a third gradient ($G_{ytr}$) and a fourth gradient ($G_{zr}$) and then applying a slice-selective refocusing RF pulse; and acquiring magnetic resonance data from the object. In further embodiments $G_{yt}$ comprises a gradient applied along a non-slice-selection axis and $G_z$ comprises an image slice selection gradient applied along the z-axis. In certain embodiments $G_{yt}$ and $G_z$ are chosen such that the image slice selected by the excitation RF pulse is tilted by an angle $\Theta_y$ relative to the image slice selected by the refocusing RF pulse. In particular embodiments $G_{ytr}$ comprises a third gradient applied along a non-slice-selection axis (e.g., the phase-encoding axis) and $G_{zr}$ comprises a slice refocusing gradient or a combination of a slice refocusing gradient and a slice-selection crusher gradient.

Methods as disclosed herein further comprise, in specific embodiments, generating and displaying an image based on the acquired magnetic resonance data.

In specific embodiments, $G_{yt}$ and $G_z$ are selected such that angle $\Theta_y$ can be from about 0.1° to about 70°. In further specific embodiments, $G_{yt}$ and $G_z$ are selected such that angle $\Theta_y$ can be from about 0.1° to about 50°. In additional specific embodiments, $G_{yt}$ and $G_z$ are selected such that angle $\Theta_y$ can be from about 0.1° to about 25°. In other specific embodiments, $G_{yt}$ and $G_z$ are selected such that angle $\Theta_y$ can be from about 0.1° to about 10°. In particular embodiments, $G_{yt}$ and $G_z$ are selected such that angle $\Theta_y$ can be from about 0.1° to about 3°. In further particular embodiments, $G_{yt}$ and $G_z$ are selected such that angle $\Theta_y$ is about 2°.

In certain embodiments, a method as disclosed herein is applied to an MRI slice that is selected by the refocusing RF pulse, wherein the slice comprises a thickness of about 1 mm to about 10 mm (e.g., about 1 mm, 2 mm, 3 mm, 4 mm, 5 mm, 6 mm, 7 mm, 8 mm, 9 mm, or 10 mm).

Particular embodiments of the methods disclosed herein comprise modification of a conventional fast spin echo (FSE) pulse sequence wherein the slice selected by the RF excitation pulse is slightly tilted with respect to the slice selected by the subsequent RF refocusing pulses. With this modification, peripheral magnetization that would cause the cusp artifact does not experience both RF excitation and refocusing pulses, leading to artifact reduction or even elimination.

Figure 2:
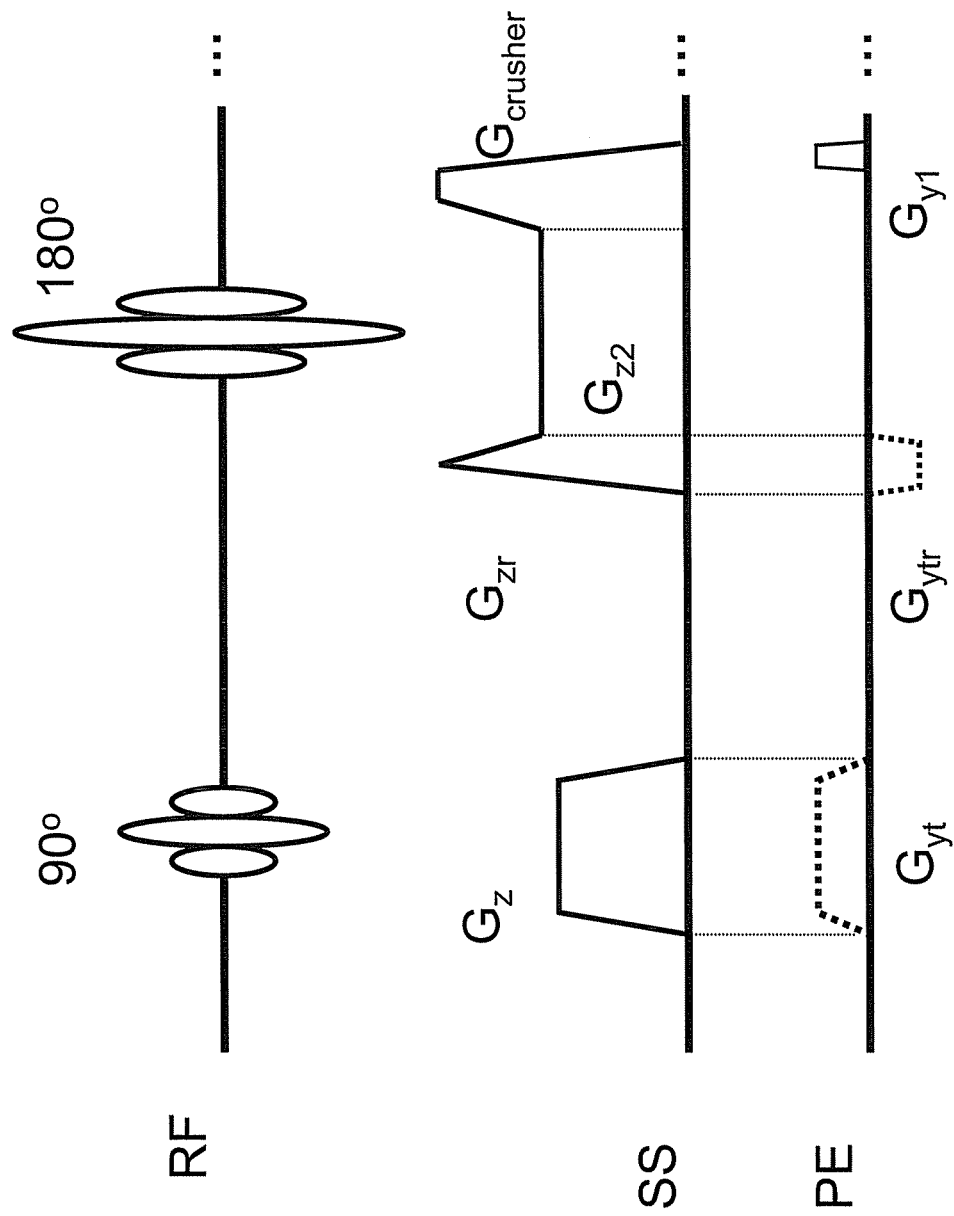
FIG. 2 depicts a segment of the modified FSE pulse sequence, illustrating the slice-tilting gradient $G_{yt}$ and its rewinder $G_{ytr}$ (dotted lines). $G_z$ is the modified slice selection gradient. $G_{zr}$ is the left crusher gradient combined with the rewinder for $G_z$. SS and PE denote the slice-selection and the phase-encoding gradient axis, respectively.
Figure 3:
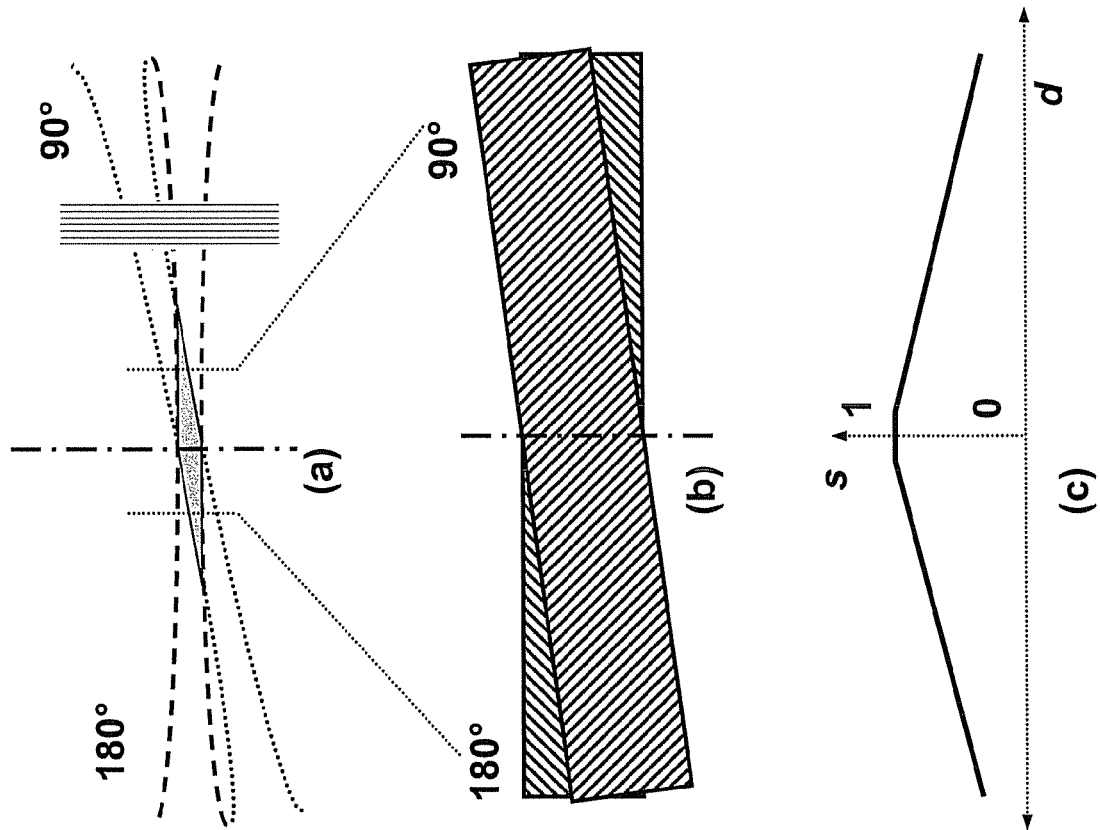
FIG. 3 (a) depicts slice profiles for the 90° and 180° RF pulses in FSE, conceptually showing the overlapping region (shaded) and the location of the source of the artifact (parallel vertical lines). The profiles of the slices reflect the nonlinearity of the gradient. (b) depicts the zoomed profile of slice overlap for the 90° and 180° pulses within the FOV. (c) depicts normalized theoretical signal loss S (vertical axis) along the slice tilt direction d (horizontal axis).

The methods disclosed herein can be implemented on most commercially-available MRI apparatus that is equipped with a conventional FSE pulse sequence. As depicted in FIG. 2, a small "slice-selection" gradient, $G_{yt}$, can be introduced along a non-slice-selection axis (e.g., the phase-encoding axis (x or y)) concurrently with the nominal slice selection gradient (along the z-direction by convention) during the RF excitation pulse. With the $G_{yt}$ gradient, the slice selected by the RF excitation pulse is effectively tilted away by a small angle $\Theta_y$ from the nominal slice selected by the RF refocusing pulses (FIGS. 3a,b).

In certain embodiments $G_{yt}$ is concurrent in time with the nominal slice selection gradient, so the amplitude of the nominal gradient must be considered, wherein it is adjusted in order to maintain the desired image slice thickness. The resultant slice selection gradient $G_z$ and the tilt gradient $G_{yt}$ are calculated by solving the simultaneous equations:

$$\Theta_y = \arctan(G_{yt}/G_z) \quad [1]$$

$$G^2_s = G^2_{yt} + G^2_z \quad [2]$$

where $G_S$ is the amplitude of the nominal slice selection gradient. For off-centered slices, the RF transmitter frequency is adjusted accordingly to account for the frequency offset arising from both $G_{yt}$ and $G_z$.

Similar to the nominal slice-refocusing gradient, an additional slice-refocusing gradient, $G_{ytr}$, may be designed and applied together with a left crusher gradient of a first refocusing RF pulse, $G_{zr}$ (FIG. 2). The constraints (e.g., pulse width, slew rate, gradient amplitude) on the design of $G_{yt}$ and $G_{ytr}$ impose a limit on the maximal value of the user-selectable tilt angle $\Theta_y$, beyond which $G_{ytr}$ would be unable to completely rephase the spins. In specific embodiments, this maximum allowable tilt angle can be significantly large; for example, in studies conducted in accordance with the disclosure, the maximal tilt angle was more than 70° for a slice thickness of 5 mm with the slew rate set to 90% of the maximum (150 T/m/sec) of exemplary equipment disclosed in the Examples. As noted below, a tilt angle of such magnitude is considerably larger than any tilt angle required for practical implementation of the technique.

While a particular embodiment is depicted in FIG. 2 (e.g., illustrating $G_{yt}$ only along the phase encoding direction), in various embodiments the tilt can also be applied along the readout direction, the phase-encoding direction, or both the readout and phase-encoding directions. Embodiments comprising a slice-tilting gradient applied to a single logical axis, are referred to herein as "orthogonal tilt." Embodiments wherein the slice-tilting gradient is implemented on both axes, are referred to herein as "oblique tilt," merely for purposes of clarity in the disclosure. In embodiments comprising an oblique tilt, two user-defined tilt angles, $\Theta_x$ and $\Theta_y$, can be chosen independently along the two orthogonal axes, respectively. The "slice-selection" gradient on the readout axis, $G_{xt}$, may be designed in a manner analogous to $G_{yt}$, described by Eq. 1, which involves solving three simultaneous equations (Eqs. 1, 3, and 4).

$$\Theta_x = \arctan(G_{xt}/G_z) \quad [3]$$

$$G^2_s = G^2_{xt} + G^2_{yt} + G^2_z \quad [4]$$

In some embodiments, the slice-rephasing gradient for $G_{xt}$ can be combined with the readout pre-phasing gradient.

In certain aspects, the disclosure provides a computer readable medium having stored thereon a set of instructions executable by a computing device controlling a magnetic resonance imaging (MRI) apparatus, to cause the MRI apparatus to perform the functions of: applying to an object in the MRI apparatus an excitation radiofrequency (RF) pulse simultaneously with a first gradient ($G_{yt}$) and a second gradient ($G_z$); applying to the object in the MRI apparatus a third gradient ($G_{ytr}$) and a fourth gradient ($G_{zr}$) and then applying a slice-selective refocusing RF pulse; and acquiring magnetic resonance data from the object; wherein $G_{yt}$ comprises a gradient applied along a non-slice-selection axis (e.g., the phase-encoding axis) and $G_z$ comprises a slice selection gradient applied along the z-axis such that the slice selected by the excitation RF pulse is tilted by an angle $\Theta_y$ relative to the slice selected by the refocusing RF pulse; and wherein $G_{ytr}$ comprises a third gradient along the non-slice-selection axis (e.g., the phase-encoding axis) and $G_{zr}$ comprises a slice refocusing gradient or a combination of a slice refocusing gradient and a slice-selection crusher gradient.

It should be understood that any of the methods described herein could be implemented within hardware, software, or any combination thereof. For example, when a method is implemented in software, it should be noted that the method can be stored on any computer-readable medium for use by, or in connection with, any computer-related system or method. The methods can be embodied in any computer-readable medium for use by or in connection with an instruction execution system, apparatus, or device, such as a computer-based system, processor-containing system, or other system contained within the MRI apparatus that can fetch the instructions from the instruction execution system, apparatus, or device and execute the instructions to perform the methods and functions mentioned herein.

Any process descriptions, steps, or blocks in flow diagrams should be understood as potentially representing modules, segments, or portions of code which include one or more executable instructions for implementing specific logical functions or steps in the process, and alternate implementations are included within the scope of the preferred embodiments of the methods in which functions may be executed out of order from that shown or discussed, including substantially concurrently or in reverse order, depending on the functionality involved, as would be understood by those reasonably skilled in the art.

In some embodiments, where the method is implemented in hardware, the method can be implemented with any, or a combination of, the following technologies: (a) discrete logic circuit(s) having logic gates for implementing logic functions upon data signals, an application-specific integrated circuit (ASIC) having appropriate combinational logic gates, (a) programmable gate array(s) (PGA), a field programmable gate array (FPGA), etc; or can be implemented with other technologies now known or later developed.

In embodiments, the set of instructions may further cause the computing device to generate an image based on the acquired data. See, for example, Zhou et al., Method and Apparatus for Producing Diffusion-Weighted MR Images. U.S. Pat. No. 6,323,646, granted Nov. 27, 2001, which is herein incorporated by reference in its entirety.

In additional aspects, the disclosure provides a magnetic resonance imaging (MRI) apparatus comprising: an MRI system having a plurality of gradient coils positioned about a bore of a magnet to impress a polarizing magnetic field and an radio frequency (RF) transceiver system and an RF switch controlled by a pulse module to transmit RF signals to an RF coil assembly to acquire MR images; and a computer programmed to (i) apply to an object in the MRI apparatus an excitation radiofrequency (RF) pulse simultaneously with a first gradient ($G_{yt}$) and a second gradient ($G_z$), (ii) subsequently apply to an object in the MRI apparatus a third gradient ($G_{ytr}$) and a fourth gradient ($G_{zr}$) and then apply a slice-selective refocusing RF pulse, and (iii) acquiring magnetic resonance data from the object; wherein $G_{yt}$ comprises a gradient applied along a non-slice-selection axis (e.g., the phase-encoding axis) and $G_z$ comprises a slice selection gradient applied along the z-axis such that the slice selected by the excitation RF pulse is tilted by an angle $\Theta_y$ relative to the slice selected by the refocusing RF pulse; and wherein $G_{ytr}$ comprises a third gradient along a non-slice-selection axis (e.g., the phase-encoding axis) and $G_{zr}$ comprises a slice refocusing gradient or a combination of a slice refocusing gradient and a slice-selection crusher gradient.

As noted above, the methods set forth herein may be utilized and incorporated into an available MRI scanner, or implemented into any existing FSE and spin echo pulse sequence or their derivatives or variations, as are known in the art.

In certain aspects, the disclosure provides methods for processing data in a magnetic resonance image (MRI) comprising: identifying a limited region with residual artifact in a magnetic resonance image; approximating the artifact region with a line whose width spans a few pixels; executing an operation that zeroes out signal intensities within the line along the phase-encoding direction of the image; and executing an operation that recovers the zeroed signal intensities from the pixels intensities immediately adjacent to the artifact region by interpolation.

In certain embodiments, the above interpolation can be linear. In other embodiments the interpolation can be non-linear.

It will be understood by those within the art that virtually any disjunctive word and/or phrase presenting two or more alternative terms, whether in the description, claims, or drawings, should be understood to contemplate the possibilities of including one of the tenus, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The Examples that follow are merely illustrative of certain embodiments and are not to be taken as limiting.

EXAMPLES

Example 1

Determination of Tilt Angle

Figure 4:
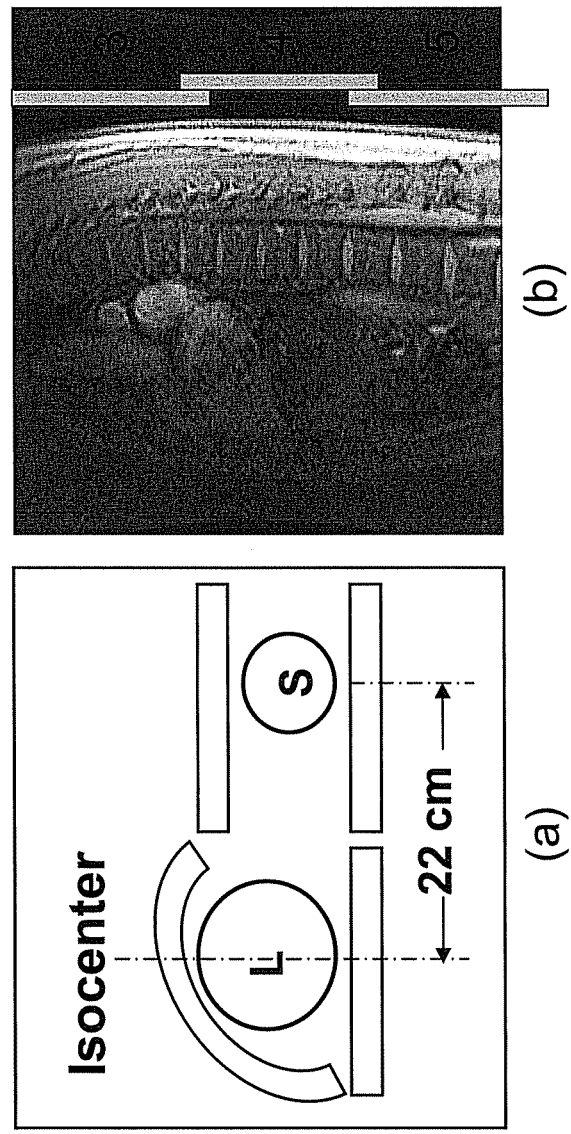
FIG. 4 (a) depicts the setup of the phantom experiment (Example 1) using the neurovascular coil (shaded elements), showing the larger (L) and smaller (S) phantoms. The source of the artifact is indicated by the parallel vertical lines. (b) depicts the setup of the sagittal thoracic spine experiment (Example 3) showing the approximate locations of the active elements (3-5) of the cervical-thoracic-lumbar coil.

The modified FSE pulse sequence was implemented on two GE Signa HDx MRI scanners (GE Healthcare) at 3.0 T and 1.5 T, respectively. Both scanners were equipped with a cardiac resonator module gradient subsystem (maximum gradient strength=40 mT/m, maximum slew rate=150 T/m/sec). Using this pulse sequence, a phantom study was performed to determine the optimal tilt angle under several experimental conditions on each of the two scanners. On the 3.0 T scanner an 18 cm (DSV) spherical phantom containing dimethyl silicone, gadolinium, and colorant was placed inside a four-element neurovascular RF coil (USA Instruments, Cleveland, Ohio). On the 1.5 T scanner, a similar phantom filled with water (18 cm DSV, 3.3685 g/L $NiCl_2.6H_2O$ and 2.4 g/L NaCl) was scanned with an eight-element neurovascular RF coil (Medrad Inc., Indianola, Pa.). To mimic the source of the FSE cusp artifact, a smaller (11-cm DSV, 3.3685 g/L $NiCl_2.6H_2O$ and 2.4 g/L NaCl) water phantom was placed approximately 22 cm away from the isocenter (i.e., along the positive z-axis) (FIG. 4a). The position of this phantom was adjusted such that it produced the strongest cusp artifact over a FOV of 24 cm. With this setup, the optimal tilt angle was determined as the smallest angle that minimized both the intensity and the extent of the FSE cusp artifact while leaving the signal within the FOV minimally affected. On each scanner, a set of calibration experiments was performed to establish the relationship between the optimal tilt angle and several scan parameters. In the first calibration, the slice thickness was increased from 2 to 10 mm in increments of 2 mm, while keeping all other parameters the same (see below for phantom experiment parameters). At each slice thickness, the optimal tilt angle was determined. In the second calibration, the relationship between the slice thickness and the optimal tilt angle was examined at two additional FOVs, 26 cm and 28 cm. Last, the influence of echo train length (ETL) on the cusp artifact and, consequently, on the optimal tilt angle was investigated by varying the ETL from 4 to 16 in increments of 2.

After the optimal tilt angle was determined under different experimental conditions, five experiments were conducted on phantoms and human volunteers to demonstrate and evaluate the performance of the proposed technique. The first experiment was carried out on phantoms (the 18 cm and 11 cm DSV spheres mentioned above) at 3.0 T, with the same setup as described above (FIG. 4a). The 18 cm phantom was scanned with a sagittal cervical spine protocol that is in clinical use. The key acquisition parameters were repetition time (TR)=2000 ms, echo time (TE)=10 ms, ETL=8, bandwidth=62.5 kHz, acquisition matrix=256×256, NEX=2, FOV=24 cm, slice thickness=5 mm, and optimal tilt angle $\Theta_y$=2.0°.

Figure 5:
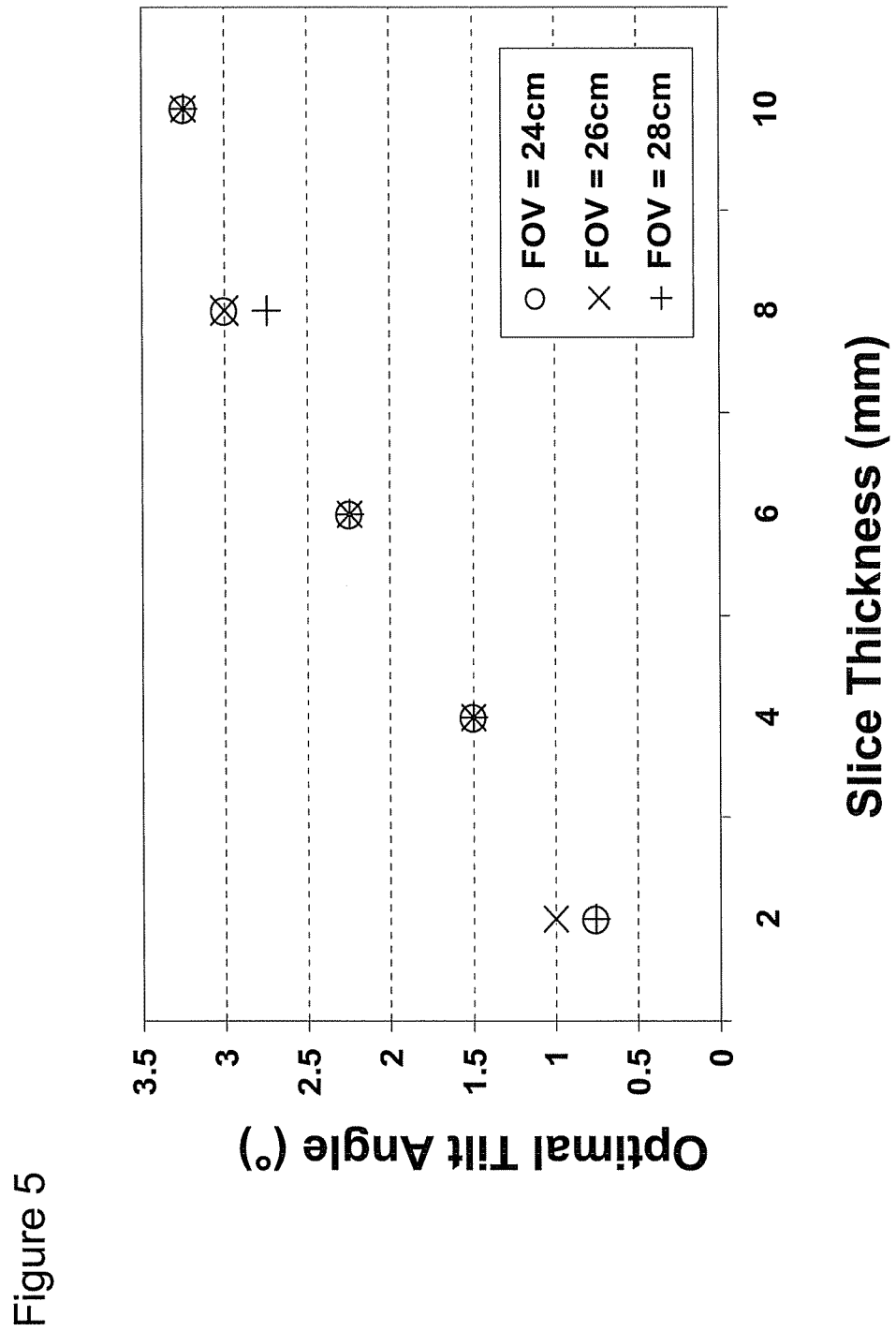
FIG. 5 depicts an optimal tilt angle $\Theta_y$ as a function of slice thickness for three different FOV.

FIG. 5 shows the optimal tilt angle obtained from the phantoms on the 3.0 T scanner as a function of the slice thickness for FOVs of 24, 26, and 28 cm, respectively. In all cases, the relationship between the slice thickness and the optimal tilt was found to be approximately linear (e.g., r=0.9883 for FOV=24 cm). The same relationship was confirmed for human volunteers (below), suggesting that the optimal tilt angles obtained on a phantom scan were usable for other scans with the same or similar slice thickness. The dependence of the optimal tilt angle on the FOV was very weak (FIG. 5), and no dependence on ETL was observed (data not shown). Similar results were also obtained from the other scanner (data not shown).

The calibration results as illustrated in FIG. 5 suggested that even though the artifact intensity was higher with a thinner slice, a smaller slice tilt may be used to create a sufficient mismatch between the slices selected by the excitation pulse and the refocusing pulses at the artifact-producing region. This geometric consideration could account for the observed linear relationship between the optimal tilt angle and the slice thickness. The two outlying points seen in FIG. 5 are within the measurement accuracy (±0.25°), as the minimum step size in $\Theta_y$ was 0.25° in the calibration. Even with the observed dependence on the slice thickness, the optimal tilt angle spanned only a narrow range (1.3°-2.3°) for slice thicknesses between 3 and 6 mm. From a practical perspective, a nominal tilt angle of about 2° can be used as a default value when the calibration data are not available or intentionally omitted, simplifying practical implementation of the technique.

Figure 6:
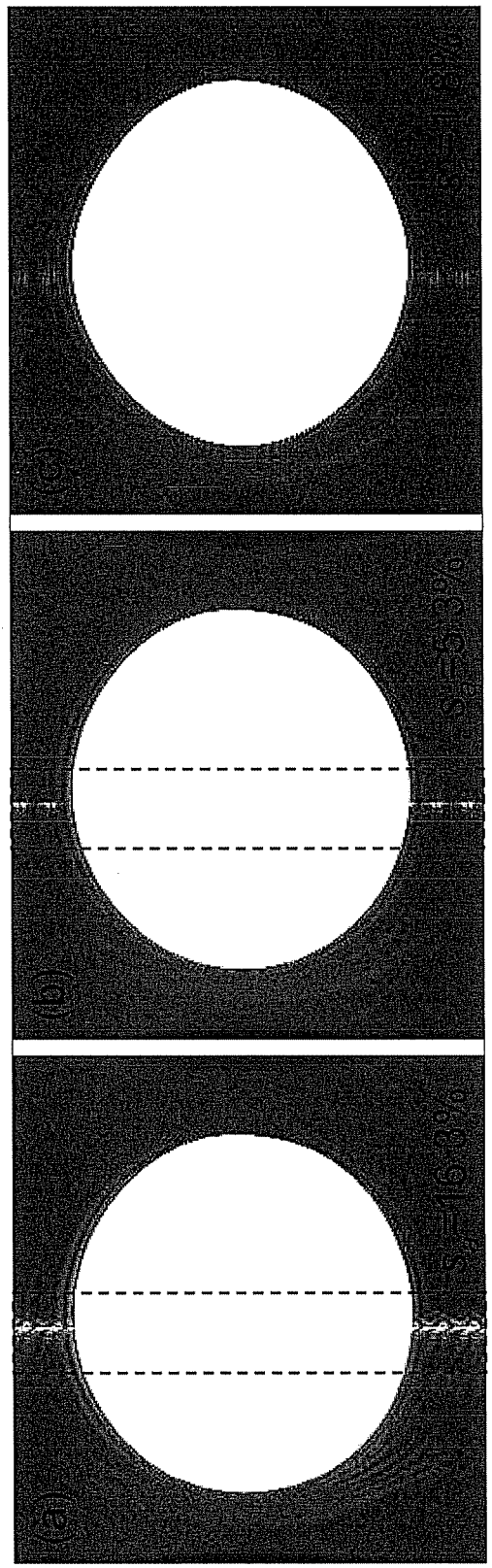
FIG. 6 depicts FSE images of an 18 cm phantom (a) without slice-tilting, (b) with tilt angle=2°, and (c) with tilt angle=2° and post-processing (see, Example 5). All images were obtained at 3.0 Tesla, using a four-element neurovascular coil. An unconventional window/level setting was used to highlight the cusp artifact, which is within the dashed box in (a) and (b). TR/TE=2000/10 ms, FOV=24 cm.

A representative result from a phantom experiment is shown in FIG. 6, where an unconventional window/level setting was used to highlight the artifact. The cusp artifact is enclosed in a dashed box on the images. (Note that the typical FSE ghosting artifacts can also be seen on the lower left side of the images. These artifacts are unrelated to the FSE cusp artifact described herein). By applying a tilt of 2° for a slice thickness of 5 mm over a FOV of 24 cm, the strength of the cusp artifact was reduced from 16.3% (FIG. 6a) to 5.3% (FIG. 6b). As a result of this substantial reduction, the featherlike structure virtually disappeared and the width of the remaining artifact was noticeably narrowed. The residual artifact strength was further reduced to ~1.8% (FIG. 6c), using the optional postprocessing step described below in Example 5.

Example 2

Removal of Artifact in Human Magnetic Resonance Images

This example was designed to validate on human subjects the phantom results obtained at 3.0 T as set forth in Example 1. The same neurovascular RF coil used in the phantom experiment was employed to obtain images from the left foot of two healthy human subjects (a 26-year-old male and a 31-year-old female). By using the same coil, results from the in vivo human studies can be compared directly with those from the phantom experiments. With the subject in a supine position, a T1-weighted sagittal foot examination was performed with the following imaging parameters: TR=600 ms, TE=20 ms, ETL=8, bandwidth=62.5 kHz, acquisition matrix=256×256, NEX=4, FOV=26 cm, slice thickness=5 mm, and optimal tilt angle $\Theta_y$=2.0°.

The optimal tilt angle, obtained from Example 1, was confirmed in a first human volunteer study. The artifact-producing region for the in vivo studies was found to be 22.5±1.0 cm away from the isocenter, just as shown in the phantom experiment above. The results from the two volunteers were compared to evaluate the performance consistency of the slice-tilting technique.

Figure 7:
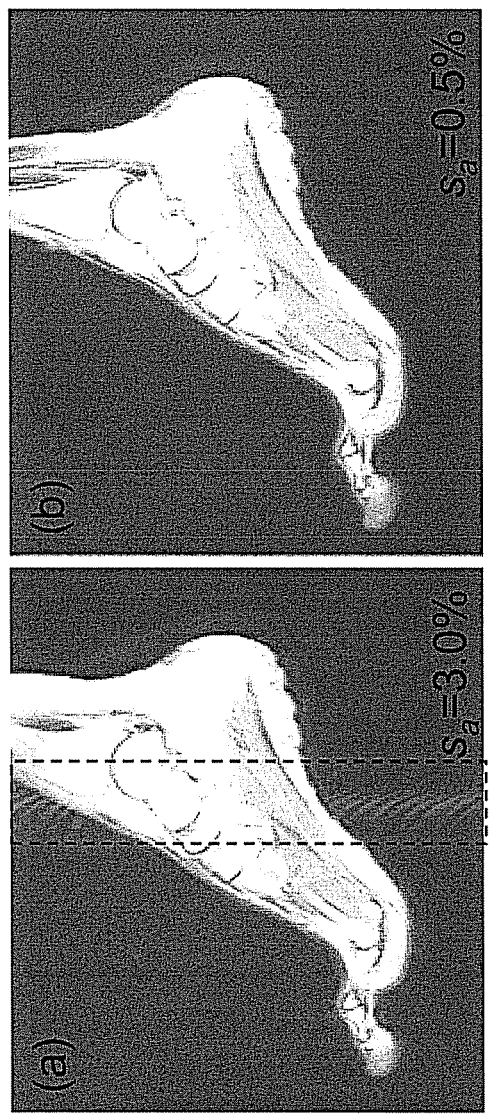
FIG. 7 depicts FSE images of human foot at 3.0 Tesla. (a) without slice tilting and (b) with slice tilting ($\Theta_y$=2°). An unconventional window/level setting was used to highlight the artifacts, which are shown within the dashed box. TR/TE=600/20 ms, FOV=26 cm.

The results from the human foot images at 3.0 T are shown in FIG. 7, where an unconventional window/level setting was used to emphasize the artifacts. For one of the volunteers, the artifact strength was reduced from 3.0% (FIG. 7a) to 0.5% (FIG. 7b) after applying a tilting angle of 2.0°. Artifacts in the resultant image were essentially invisible, even when using a window and level setting that would highlight the low signal intensities. Results from the second human volunteer showed a similar performance, with the artifact strength decreasing from 5.1% to 0.9% before and after the tilt (images not shown). These results demonstrated good subject-to-subject consistency of the slice-tilting technique from subject to subject.

Example 3

Validation of Artifact Removal in Clinical Protocol

This example was designed to evaluate the performance of the slice-tilting technique in a clinical protocol in which the FSE cusp artifact has been most problematic. Sagittal images of the thoracic spine were acquired from a 26-year-old male volunteer on the 1.5 T scanner (GE Signa) using an eight-element cervical-thoracic-lumbar spine coil provided by the equipment manufacturer (see the setup in FIG. 4b). The imaging parameters included TR=3500 ms, TE=120 ms, ETL=16, bandwidth=±15.63 kHz, acquisition matrix=256×256, NEX=2, FOV=24 cm, slice thickness=5 mm, and optimal tilt angle $\Theta_y$=2.0° with active elements 3 through 5 (FIG. 4b). Since tilting the slice can potentially affect neighboring slices, three contiguous slices without any inter-slice gap were acquired to evaluate the performance of the slice-tilting technique for multi-slice imaging.

Figure 8:
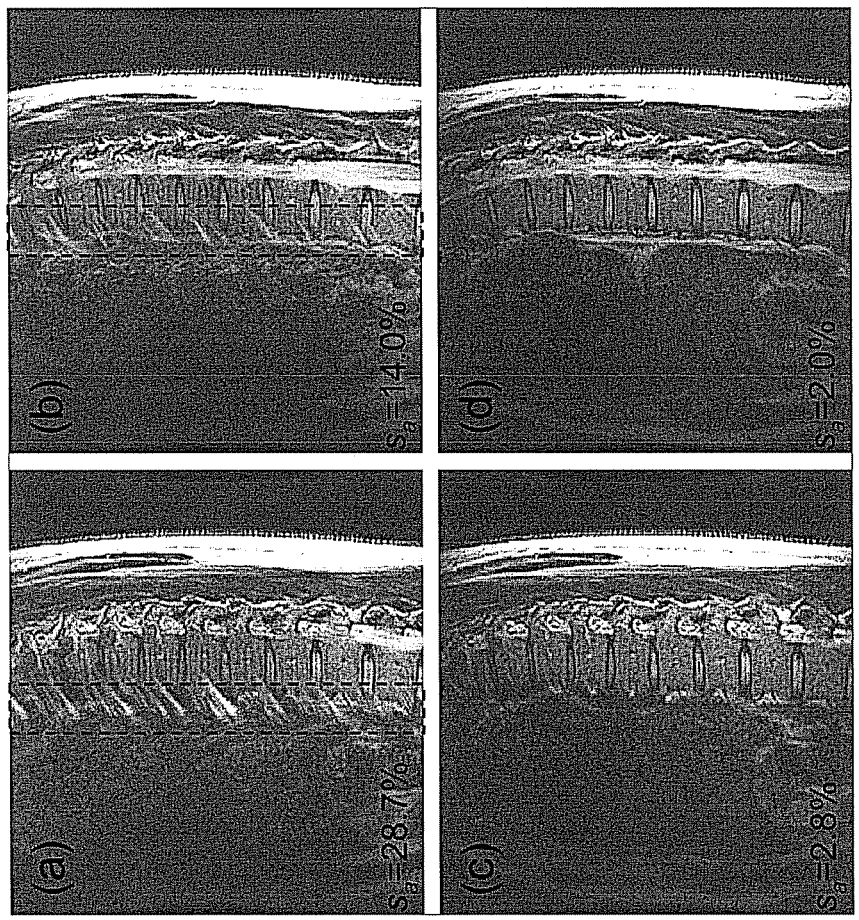
FIG. 8 depicts two adjacent sagittal images of thoracic spine at 1.5 Tesla (slice thickness=5 mm; slice gap=0 mm). (a) and (b) are without slice tilting and (c) and (d) with slice tilting ($\Theta_y$=2°). TR/TE=3500/120 ms, FOV=24 cm.

FIG. 8 shows two of the three contiguous sagittal slices before (FIGS. 8a,b) and after (FIGS. 8c,d) applying the slice-tilting technique. Before tilting, the characteristic featherlike artifacts were evident along the superior-inferior direction (i.e., the phase-encoding direction), with artifact strength as high as 14.0% (FIG. 8b) to 28.7% (FIG. 8a). After tilting, the artifact strength was reduced to 2~3% (FIGS. 8c,d), which was virtually invisible even with a window and level setting to emphasize the artifact. It is worth noting that no significant image shading was observed across the FOV after applying the slice-tilting technique. Additionally, the effect of crosstalk in the multi-slice acquisition was insignificant even without any inter-slice gap using a tilt angle of 2°.

Example 4

Comparison of Techniques for Artifact Removal

This example compared the slice-tilting technique with two other techniques available on a 3.0 T scanner for FSE cusp artifact reduction. Both of these techniques were based on a common principle of shifting the source of the cusp artifact. The first technique swapped the position of the artifact source during slice selection by reversing the direction of the slice selection gradient applied during the 90° RF excitation pulse relative to the slice selection gradient for the refocusing RF pulses. The second technique employed a different bandwidth between the RF excitation and refocusing pulses, consequently using a different slice selection gradient amplitude to dislocate the source of the artifact. In the experimental studies, the bandwidth ratio between the RF excitation and refocusing pulses was varied from 0.5 to 2.0, in steps of 0.5, while keeping the slice thickness constant at 5 mm. Both techniques were evaluated on the left foot of a human volunteer, with the same setup and protocol as described in the second experiment.

Figure 9:
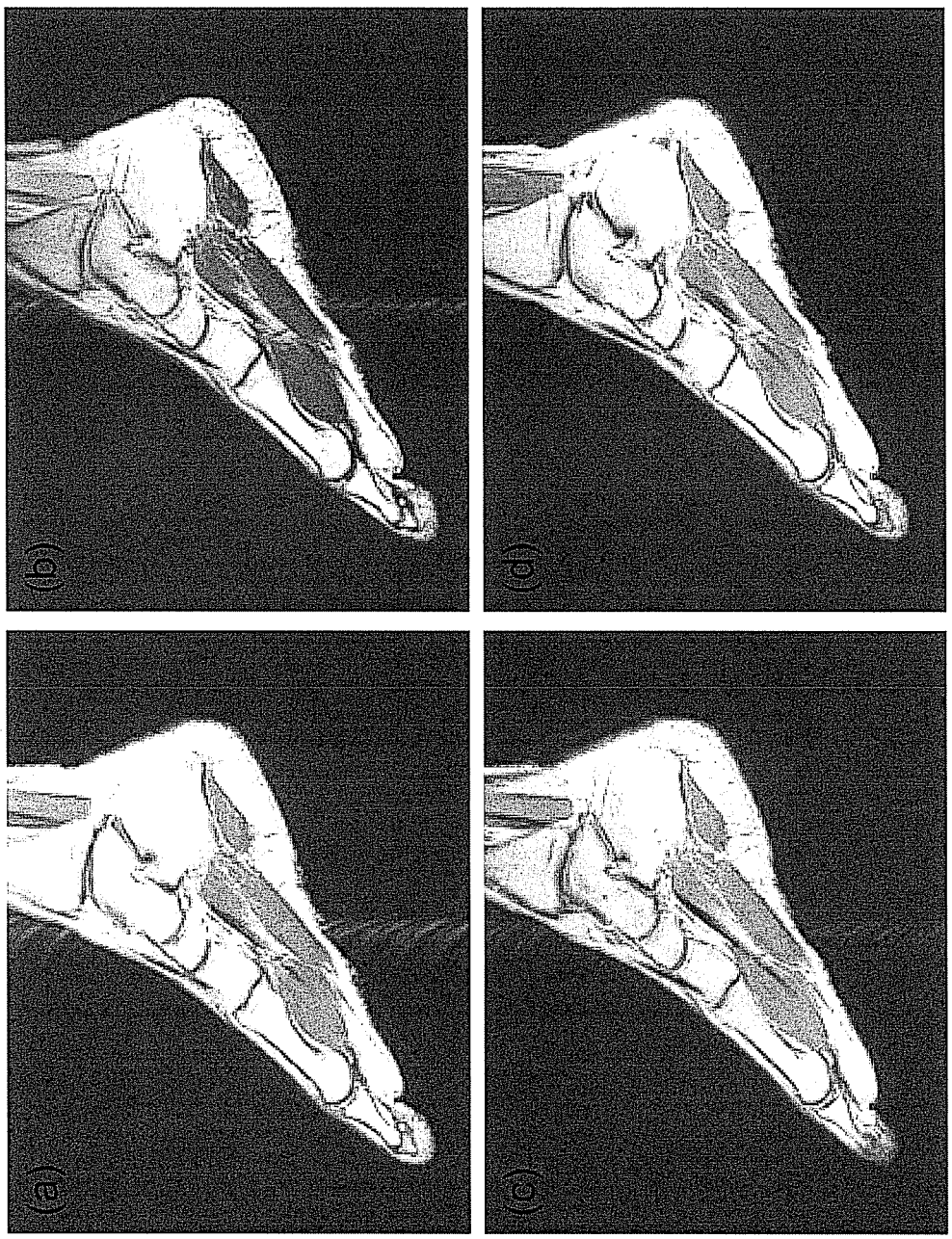
FIG. 9 depicts sagittal foot FSE images from a human volunteer, comparing the slice-tilting technique with two commercially available techniques. (a) original image. (b) image obtained by reversing the direction of the slice selection gradient during the RF excitation pulse. (c) image obtained by increasing the bandwidth of the RF excitation pulse to twice of that of the RF refocusing pulse. (d) image with slice tilting ($\Theta_y$=2°). An unconventional window/level setting was used to highlight the artifacts. TR/TE=600/20 ms and FOV=26 cm.

FIG. 9 summarizes the results and compares the slice-tilting technique with the two other techniques. FIG. 9a displays the original image without any compensatory techniques. FIGS. 9b and 9c show the result of reversing the slice selection gradient and varying the bandwidth of the RF excitation pulse to twice the original bandwidth (a bandwidth ratio of 2 was experimentally observed to give the best artifact reduction for this technique), respectively. The result of the slice-tilting technique (tilt angle=2°) is given in FIG. 9d. Visual inspection of these images clearly showed that the slice-tilting technique outperformed the other two techniques.

Example 5

Post-Processing Technique

In some experiments (e.g., Example 1; FIG. 6b), it was observed that a minor residual artifact (i.e., a thin line in the phase-encoding direction, with a width no more than two to four pixels) remained after the slice-tilting technique substantially reduced both the intensity and the width of the cusp artifact. To further reduce this residual artifact, a simple interpolation algorithm was used involving the following steps. First, a line containing the residual artifact (i.e., two to four pixels) was zeroed out along the phase-encoding direction of the image. For example, the following operation was executed, assuming that the artifact line was three pixels wide and at the center of the FOV:

$$I(i,j)=0, 1 \leq i \leq, C/2-1 \leq j \leq C/2+1, \quad [5]$$

where $I(i,j)$ denotes the image intensity of the ith row (i.e., readout direction) and the jth column (i.e., the phase-encoding direction), R is the total number of rows, and C is the total number of columns of the image. Then, along each row, the missing signal intensities were linearly interpolated from the two immediately adjacent pixels. In the example given in Eq. 5, the interpolation was performed in the following manner:

$$\begin{vmatrix} I(i, C/2-1) \\ I(i, C/2) \\ I(i, C/2+1) \end{vmatrix} = \frac{1}{4} \begin{vmatrix} 1 & 3 \\ 2 & 2 \\ 3 & 1 \end{vmatrix} \begin{vmatrix} I(i, C/2+2) \\ I(i, C/2-1) \end{vmatrix}, 1 \leq i \leq R \quad [6]$$

The use of this interpolation algorithm was optional, depending on the presence and severity of the residual artifact.

Example 6

Artifact Evaluation

The FSE cusp artifact was first visually compared before and after applying the slice-tilting technique, followed by a quantitative analysis of the artifact strength. In the quantitative analysis, three regions of interest, each comprising ~100 pixels, were selected from (i) a homogeneous region (10×10 pixels) of the object with the highest signal intensity (i.e., on the calcaneus of the foot of the volunteer, or on the subcutaneous fat of the thoracic images from the volunteer), (ii) the background (10×10 pixels) free of artifacts, and (iii) the area with the strongest artifact strength (10×10 or 20×5 pixels, depending upon the appearance of the artifact). The strength of the artifact ($s_a$) was quantified using the following equation:

$$s_a = \frac{\mu a - \mu n}{\mu o - \mu n}, \quad [7]$$

where μo, μa, and μn were the mean signal intensity of the regions of interest over the object, the artifact, and the background, respectively.

Example 7

Evaluation of Signal Uniformity

The incomplete overlap between the slices selected during the excitation and refocusing pulses causes the signal intensity at the edge of the FOV to be lower than that at the center. A study was designed to quantify the signal intensity drop at the edge of the FOV as a result of slice tilting. This experiment was conducted on the 3.0 T scanner using the body coil for both RF transmission and reception. Images were acquired from a large (~26-cm DSV) spherical phantom containing dimethyl silicone with the following parameters: TR=2000 ms, TE=10 ms, ETL=16, bandwidth=62.5 kHz, acquisition matrix=256×256, NEX=2, FOV=26 cm. The slice thickness was held constant at 2 mm while the tilt angle was increased from 0° to 3° in steps of 1°. This experiment was repeated with slice thickness of 4, 5, 6, 8, and 10 mm for single-slice and multi-slice (comprising three slices without inter-slice gap) acquisitions, respectively.

Signal uniformity was evaluated in the direction of the slice tilt (i.e., the phase-encoding direction) for all images acquired in the fifth experiment. Two regions of interest, each comprising ~100 pixels, were selected from (i) the highest signal region (10×10 pixels) at or near the center of the spherical phantom, and (ii) the lowest signal region (10×10 pixels) within 2.5 cm of the edge of the FOV on the phantom in the direction of the tilt. The signal uniformity, U, was calculated using the following equation:

$$U = 1 - \frac{\mu c - \mu e}{\mu c - \mu e}, \quad [8]$$

where μc and μe were the mean signal intensity of the regions of interest taken at the center and the edge, respectively.

Figure 10:
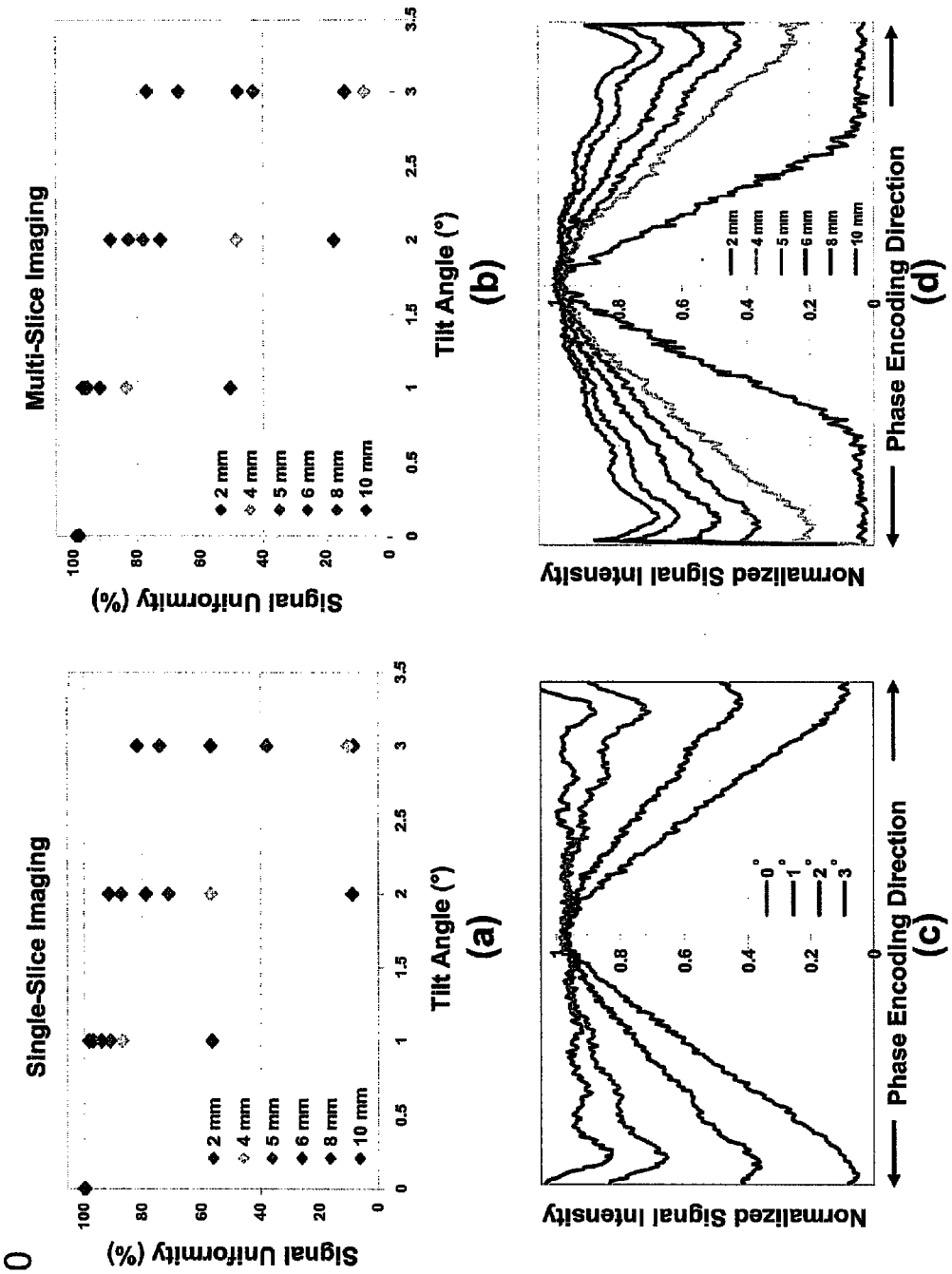
FIG. 10 depicts the signal non-uniformity in the direction of the slice tilt (i.e., the phase-encoding direction). (a) shows the signal uniformity as a function of slice thickness in single-slice imaging ($\Theta_y$=0-3°). (b) shows signal uniformity as a function of slice thickness in multi-slice imaging (central slice, slice gap=0 mm). (c) shows the normalized signal intensity profiles in the phase-encoding direction as a function of tilt angle (slice thickness=5 mm, single-slice acquisition). (d)

The results are summarized in FIG. 10. FIG. 10a shows the values of percentage signal uniformity as a function of slice thickness and tilt angle for single-slice imaging. For example, for a slice thickness of 5 mm and a tilt angle of 2°, the intensity uniformity was found to be 71%. The uniformity values for single-slice imaging are comparable to those in multi-slice imaging (FIG. 10b), suggesting that the slice-tilting technique has minimal adverse effect in multi-slice acquisitions. FIG. 10c shows a comparison of the profiles of signal intensity for tilt angles from 0° to 3° for a 5 mm slice (single-slice acquisition) along the central column in the phase-encoding direction. For a typical tilt angle (2°) used in all experiments, the worst signal drop was about 40% as compared to the signal at the center. The dependence of the signal loss on slice thickness is shown in FIG. 10d, where the tilt angle was held constant at 2° in a single-slice acquisition. The signal loss became progressively worse as the slice thickness decreased, especially below 4 mm. However, as the slice becomes thinner, the required tilt angle also decreases (see, FIG. 5), which substantially compensates for the signal loss illustrated in FIGS. 10a-c.

Taken together, these examples demonstrate that a small slice-tilting gradient along a non-slice-selection axis during RF excitation can significantly reduce the intensity and the spatial extent of the FSE cusp artifact. The optimal tilt angle can be determined by using a simple calibration procedure on a phantom and applied to a broad range of protocols encountered in clinical imaging. The dependence of the optimal tilt angle on slice thickness, FOV, and ETL as also described above, revealed a linear relationship with respect to slice thickness and no significant dependence on FOV or ETL. This technique was validated on scanners operating at two different field strengths, multiple RF coils, a number of clinical protocols, and both phantoms and human volunteers. Consistent and reproducible artifact reduction was observed in all cases.

The data also suggested that the strength of the artifact was inversely proportional to the slice thickness. For example, the artifact strength increased from 11.2% to 21.9% when the slice thickness decreased from 8 to 4 mm. A thinner slice requires a stronger gradient, which can move the artifact-prone region closer to the sensitive region of the RF receiving coil, leading to a stronger artifact. This explanation is in agreement with the fact that the bandwidth of the RF pulse (and thus the slice selection gradient amplitude) can alter the appearance of the FSE cusp artifact, as exploited in one of the commercial techniques evaluated in our study (FIG. 9c). Further, in Examples involving human subjects, there was no observation of a monotonic relationship between the artifact intensity and the RF excitation bandwidth. Without being limited to a particular theory, this observation could result from a continuous distribution of spins in human subjects that could support a broad range of artifact-prone regions. This is different from the situation in calibration scans where the artifact-prone region is limited to a specific location. This may explain the residual artifact after slice-tilting that is observable in some experimental studies (e.g., FIG. 6b).

Another possible source for the residual artifact may arise from the location where the spatial derivative of the overall magnetic field $B_{tot}=B_0+z\times G$ is zero. At this location, the slice orientation may not be effectively tilted by a tilting gradient. Since this location theoretically corresponds to only one point, the resulting residual artifact is expected to have a very narrow width, essentially turning the "featherlike" appearance of the artifact into a thin dotted line as small as two pixels wide (e.g., FIG. 6b). The data provided herein demonstrates that the optional post-processing technique comprising interpolation of the problematic data can further reduce this residual artifact (FIG. 6c). As the exemplary data has shown, in embodiments comprising a residual artifact that is thin (typically about two to four pixels), linear interpolation does not significantly blur the image, especially when the signal change was gradual. Accordingly, the post-processing interpolation algorithm can be employed based on the particular need, and further, can be applied either prospectively or retrospectively (before or after data acquisition).

While the illustrative embodiments described in the Examples focus primarily on addressing the reduction of FSE cusp artifact, the methods and concepts behind the methods can be applied more broadly to address problems in other magnetic resonance imaging applications.

The invention claimed is:

1. A method for reducing the appearance of an artifact in a magnetic resonance image of an object comprising:
    applying an excitation radiofrequency (RF) pulse simultaneously with a gradient ($G_{yt}$) along a non-slice-selection axis and a slice selection gradient ($G_z$), and
    subsequently applying a slice-selective refocusing radiofrequency (RF) pulse;
    wherein $G_{yt}$ tilts the image slice selected by the excitation RF pulse by an angle $\Theta_y$ relative to the image slice selected by the refocusing RF pulse.

2. A method for reducing the appearance of an artifact in a magnetic resonance image of an object comprising:
    (a) applying to the object an excitation radiofrequency (RF) pulse simultaneously with a first gradient ($G_{yt}$) and a second gradient ($G_z$); and
    (b) subsequently applying to the object a third gradient ($G_{ytr}$) and a fourth gradient ($G_{zr}$) and then applying a slice-selective refocusing RF pulse;
    (c) acquiring magnetic resonance data from the object;
    wherein $G_{yt}$ comprises a gradient applied along a non-slice-selection axis and $G_z$ comprises a slice selection gradient applied along the z-axis such that the image slice selected by the excitation RF pulse is tilted by an angle $\Theta_y$ relative to the image slice selected by the refocusing RF pulse; and
    wherein $G_{ytr}$ comprises a third gradient along the non-slice-selection axis and $G_{zr}$ comprises a slice refocusing gradient or a combination of a slice refocusing gradient and a slice selection crusher gradient.

3. The method of claim 2 further comprising: generating and displaying an image based on the acquired magnetic resonance data.

4. The method of claim 3, further comprising, after generating the image based on the acquired magnetic resonance data and prior to displaying the image:
    (a) identifying a residual artifact in the image;
    (b) fitting the artifact in the shape of a line;
    (c) executing an operation that zeroes out signal intensities within the line of (b) in the phase-encoding direction of the image; and
    (d) executing an operation that interpolates the zeroed signal intensities from data represented as pixels immediately adjacent to the line of (b).

5. The method of claim 2 wherein the $G_{yt}$ and $G_z$ are selected such that angle $\Theta_y$ is from about 1° to about 3°.

6. The method of claim 2 wherein the appearance of the artifact is reduced by more than 50%.

7. The method of claim 6 wherein the appearance of the artifact is reduced by more than 75%.

8. The method of claim 2 wherein the slice selected by the refocusing RF pulse comprises a thickness of about 2 mm to 7 mm.

9. The method of claim 8, wherein the slice selected by the refocusing RF pulse comprises a thickness of about 3 mm to 6 mm.

10. The method of claim 2 wherein the non-slice-selection axis is a phase-encoding axis.

11. The method of claim 2 wherein the non-slice-selection axis is a readout axis.

12. An article of manufacture including a non-transitory computer readable medium having instructions stored thereon that, in response to execution by a computing device, cause the computing device to control a magnetic resonance imaging (MRI) apparatus to perform operations comprising:
- (a) applying an excitation radiofrequency (RF) pulse simultaneously with a first gradient ($G_{yt}$) and a second gradient ($G_z$) to an object in the MRI apparatus;
- (b) applying to the object a third gradient ($G_{ytr}$) and a fourth gradient ($G_{zr}$) and then applying a slice-selective refocusing RF pulse; and
- (c) acquiring magnetic resonance data from the object;

wherein $G_{yt}$ comprises a gradient applied along a non-slice-selection axis and $G_z$ comprises a slice selection gradient applied along the z-axis such that the slice selected by the excitation RF pulse is tilted by an angle $\Theta_y$ relative to the slice selected by the refocusing RF pulse; and wherein $G_{ytr}$ comprises a third gradient along the said non-slice-selection axis and $G_{zr}$ comprises a slice refocusing gradient or a combination of a slice refocusing gradient and a slice-selection crusher gradient.

13. The article of manufacture of claim 12, wherein the instructions further causes the computing device to generate and display an image based on data acquired.

14. The article of manufacture of claim 13, wherein the instructions further causes the computing device, after generating the image based on the acquired magnetic resonance data and prior to displaying the image, to:
- (a) identify a residual artifact in the image;
- (b) fit the artifact in the shape of a line;
- (c) execute an operation that zeroes out signal intensities within the line of (b) in the phase-encoding direction of the image; and
- (d) execute an operation that interpolates the zeroed signal intensities from data represented as pixels immediately adjacent to the line of (b).

15. A magnetic resonance imaging (MRI) apparatus comprising:
- (a) an MRI system having a plurality of gradient coils positioned about a bore of a magnet to impress a polarizing magnetic field and an radio frequency (RF) transceiver system and an RF switch controlled by a pulse generation module to transmit RF signals to an RF coil assembly to acquire MR images; and
- (b) a computing device configured to:
  - (i) apply an excitation radiofrequency (RF) pulse simultaneously with a first gradient ($G_{yt}$) and a second gradient ($G_z$) to an object in the MRI apparatus;
  - (ii) apply to the object a third gradient ($G_{ytr}$) and a fourth gradient ($G_{zr}$) and then applying a slice-selective refocusing RF pulse; and
  - (iii) acquire magnetic resonance data from the object;
    wherein $G_{yt}$ comprises a gradient applied along a non-slice-selection axis and $G_z$ comprises a slice selection gradient applied along the z-axis such that the slice selected by the excitation RF pulse is tilted by an angle $\Theta_y$ relative to the slice selected by the refocusing RF pulse; and
    wherein $G_{ytr}$ comprises a gradient along the said non-slice-selection axis and $G_{zr}$ comprises a slice refocusing gradient or a combination of a slice refocusing gradient and a slice-selection crusher gradient.

\* \* \* \* \*